United States Patent [19]

Lee

[11] Patent Number: 5,002,464
[45] Date of Patent: Mar. 26, 1991

[54] DOUBLE BUFFER VACUUM SYSTEM

[76] Inventor: Hyeong G. Lee, 1050-8, Suite 101, Sadang-dong, Dongjak-ku, Seoul, Rep. of Korea

[21] Appl. No.: 285,967

[22] PCT Filed: Apr. 16, 1988

[86] PCT No.: PCT/KR88/00008

§ 371 Date: Dec. 8, 1988

§ 102(e) Date: Dec. 8, 1988

[87] PCT Pub. No.: WO88/08044

PCT Pub. Date: Oct. 20, 1988

[30] Foreign Application Priority Data

Apr. 16, 1987 [KR] Rep. of Korea ............... 87-5476U

[51] Int. Cl.$^5$ .............................................. C23C 14/74
[52] U.S. Cl. .................................. 417/152; 417/53
[58] Field of Search ............ 417/152, 53, 423.2; 220/420

[56] References Cited

U.S. PATENT DOCUMENTS

| | | | |
|---|---|---|---|
| 2,550,040 | 4/1951 | Clar | 220/420 |
| 3,189,211 | 6/1965 | Podlaseck, Jr. | 220/420 |
| 3,649,339 | 3/1972 | Smith | 417/152 |
| 4,504,194 | 3/1985 | Holden | 417/53 |
| 4,654,229 | 3/1987 | Morita et al. | 118/308 |

FOREIGN PATENT DOCUMENTS

| | | |
|---|---|---|
| 0008807 | 3/1980 | European Pat. Off. . |
| 0113511 | 9/1979 | Japan ............... 417/442 |

Primary Examiner—Leonard E. Smith
Assistant Examiner—Robert N. Blackmon
Attorney, Agent, or Firm—Lieberman, Rudolph & Nowak

[57] ABSTRACT

The subject invention provides a double buffer vacuum system having a high vacuum inner chamber, a rough vacuum outer chamber, two rough vacuum pumps, a high vacuum pump, and two vacuum gauges. The double buffer vacuum system is adaptable for use in equipment requiring high or ultrahigh vacuum. The subject invention facilitates manufacturing and reduces the cost of materials used in the walls of the chambers. In addition, this system minimizes vacuum leakage through its use of a two vacuum system.

9 Claims, 4 Drawing Sheets

DOUBLE BUFFER VACUUM SYSTEM

BACKGROUND OF THE INVENTION

1. Field of the Invention

The present invention relates generally to a vacuum system for use in equipment requiring a high, or ultrahigh vacuum, and more particulary, to a double buffer vacuum system for minimizing the vacuum leakage, wherein a high vacuum inner chamber itself and high vacuum components connected thereto are disposed within a rough vacuum outer chamber which is exposed directly to the atmosphere.

2. Description of the Prior Art

With the growth of the machine, electronic and semiconductor industries, vacuum systems, especially high, or ultrahigh vacuum systems, have been widely utilized in the various fields of industry. Representative examples of equipment requiring high, or ultrahigh vacuum systems are vacuum evaporation equipment, sputtering equipment, ion plating equipment, freeze drying equipment, vacuum melting and casting equipment, the heat treatment furnace equipment, etc.

The conventional high vacuum, or ultrahigh vacuum system typically includes a high, or ultrahigh vacuum chamber for producing the high, or ultrahigh vacuum zone, in which a plurality of plate members are welded with each other at their periphery. The vacuum chamber generally has a cooling and heating coil, and a vacuum gauge disposed hermetically in the base plate thereof, and communicates with one end of T-shaped adapter tube. A sleeve-like side flange of T-shaped adapter tube is connected to a rough vacuum pump via a first valve and a rough vacuum line, whereas the other end of T-shaped adapter tube is connected to the rough vacuum pump via a gate valve, a high vacuum pump and a second valve. Thus, the high vacuum can be produced in the high vacuum chamber of the high vacuum system by the rough and high vacuum pumps.

However, in a high vacuum (about $10^{-3}$ to $10^{-7}$ mbar), or ultrahigh vacuum (about $10^{-7}$ mbar or more) system, the high vacuum chamber itself and the high vacuum components connected thereto generally require a high leak-tightness, or sealing ability in order to permit the vacuum leakage not to affect the efficiency of the high vacuum system. Actually, the leak-tightness problem of the high vacuum chamber itself and the high vacuum components connected thereto constitutes the main problem area for high vacuum systems and significantly contributes to the utilization factor in the equipments requiring the high vacuum system.

Heretofore, the conventional high vacuum system has been manufactured to directly expose the high vacuum chamber itself and the high vacuum components connected thereto to the atmosphere. A study revealed that the high pressure difference between the atmospheric pressure and the inner pressure of the high vacuum system is caused by the direct atmospheric exposure of the high vacuum chamber itself and the high vacuum components connected thereto. For example, assuming that the inner pressure of the high vacuum chamber is $10^{-7}$ mbar, the pressure difference between the inside (about $10^{-7}$ mbar) and outside (about 1013 mbar) of the high vacuum system is almost one atmosphere. This high pressure difference may causes the following problems as follows:

(1) It is possible that large amounts of air gas molecules may penetrate into the high vacuum chamber through the microscopic defects in the welded portions of wall members if the welding is poor.

(2) The high vacuum system may leak large amounts of gas molecules in locations where high vacuum components, including door, the are connected with the high vacuum chamber by means of a sealing means such as O-rings.

In theory, the leakage quantity per second Q occurs due to pressure diff between the inside and outside of the high vacuum system generally is given by following formula;

$$Q = (P_1 - P_2) \times C$$

where $P_1$ is the outside pressure of the high vacuum system, $P_2$ is the inside pressure of the high vacuum system, and C is the conductance of leak which is determined by the shape and size of the leak cause part of the high vacuum system. From this formula, it becomes more clear that the pressure difference between the inside and outside of the high vacuum system constitutes an important factor capable of causing the vacuum leakage.

In addition to the leak-tightness problem, an important factor effecting the efficiency or utilization factor of the high vacuum system is 'out-gassing' of the inner surface of the high vacuum chamber which can occur during operation of the high vacuum system. This may be reduced by inner surface treatment condition and the type of materials used in the wall members of the high vacuum chamber. Therefore, it is necessity to perform an inner surface treatment process, such as degreasing, polishing, coating, or ball blasting of the inner surface of the high vacuum chamber, after a plurality of wall members of the high vacuum chamber are welded with each other at their periphery. This inner surface treatment process has been proven to be difficult because it is performed with the spacial restriction of the high vacuum chamber after welding.

Consequently, a need exists for an effective system to minimize the vacuum leakage and to enable the inner surface treatment process, cleaning, or repairs to be easily performed, so as to improve the reliability and the efficiency thereof.

SUMMARY OF THE INVENTION

It is a principal object of the invention to provide an improved high or ultrahigh vacuum system which avoids the above discussed disadvantages of prior art vacuum systems, wherein a high vacuum inner chamber itself and high vacuum components connected thereto are disposed within a rough vacuum outer chamber which is exposed directly to the atmosphere, so as to minimize the vacuum leakage.

Accordingly, with this object in view, the invention discloses a double buffer vacuum system for use in the equipment requiring high, or ultrahigh vacuum, comprising a cooling and heating coil, a first vacuum gauge, and a high vacuum pump, which are mounted hermetically on the walls of the high vacuum inner chamber, and connected to the control unit for controlling the double buffer vacuum system, said system characterized by a rough vacuum outer chamber composed of first and second rough vacuum chambers which are defined, respectively, by upper and lower portions, the upper portion having a hinged outer door mounted on one side wall thereof and enclosing hermetically the high vacuum inner chamber, and the lower portion enclosing hermetically all high-vacuum components, such as the cooling and heating coil, the first vacuum gauge, and the high vacuum pump; the high vacuum inner chamber having a first exhaust valve disposed on a sleeve-shaped flange of the top wall thereof for communicating the vacuum between the high vacuum inner chamber and the first rough vacuum chamber; a base plate consisting of a center section defining the bottom wall of the high vacuum inner chamber, and a edge section defining the bottom wall of the first rough vacuum chamber, both of them defining the top wall of the second rough vacuum chamber, the edge section being bolted hermetically at the edges of the top end and bottom end surfaces thereof with, respectively, base flanges of the upper and lower portions; a second exhaust valve mounted to the given position of the edge section of the base plate to control the vacuum communication between the first and second rough vacuum chamber; a second rough vacuum pump for producing the rough vacuum, which is connected in vacuum communication with the bottom wall of the second rough vacuum chamber via a second rough vacuum line having a third valve; and a second vacuum gauge disposed hermetically in the predetermined position of the bottom wall of the second rough vacuum chamber.

More particularly, the high vacuum inner chamber is manufactured by bolting hermetically the wall members such as the wall plates on a frame composed of a plurality of bar members which are end-to-end welded. Alternatively, the frame is composed of a plurality of bar members which are bolted hermetically with vacuum sealant to facilitate manufacturing and repairs. The wall member can be thin plate, or foil which is made from stainless steel 304, or aluminium alloy.

BRIEF DESCRIPTION OF THE DRAWINGS

The invention will become more readily apparent from the following description of preferred embodiments thereof shown, by way of example only, in the accompanying drawings, wherein.

DETAILED DESCRIPTION OF THE INVENTION

Figure 1:
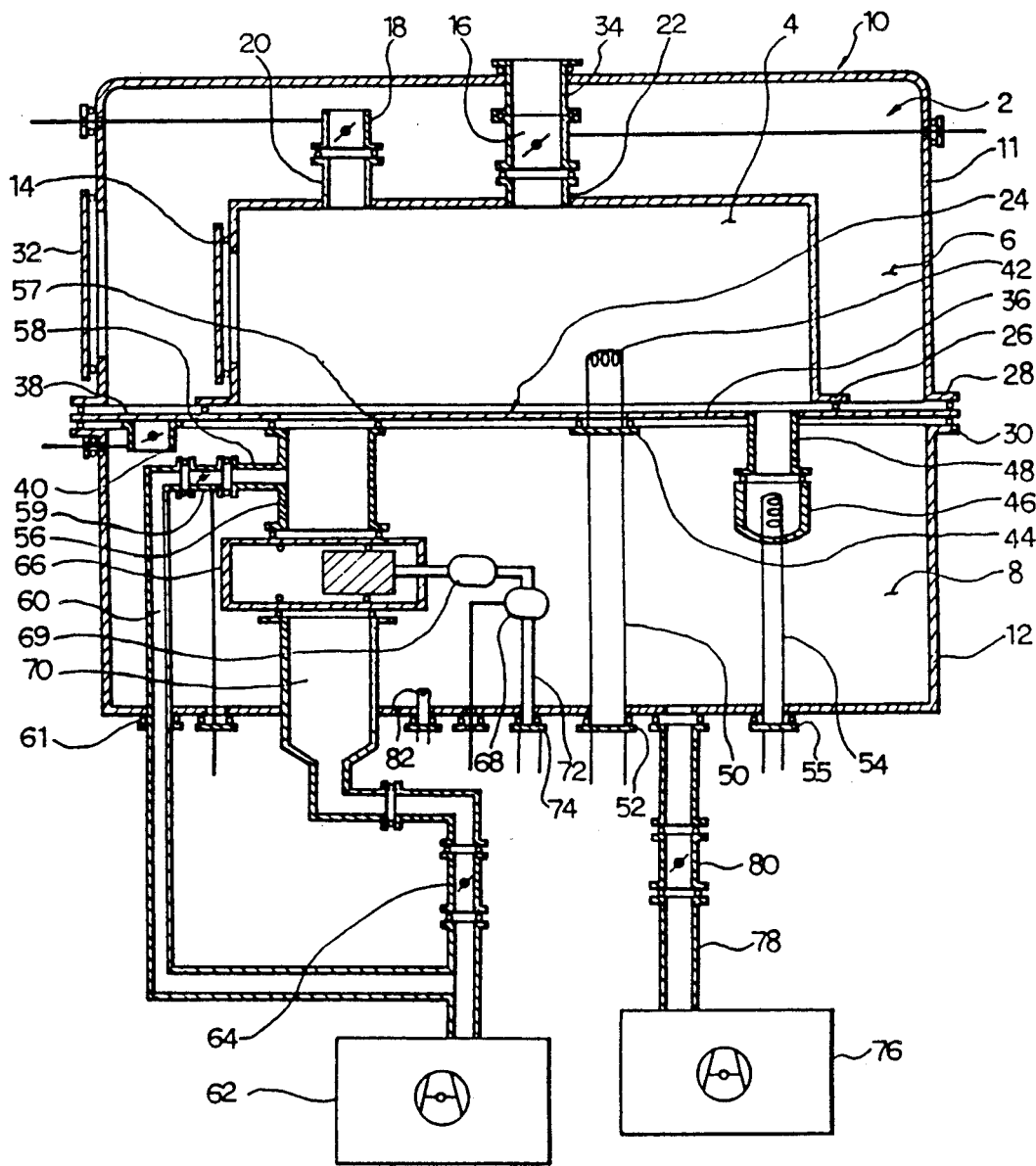
FIG. 1 is a schematic view showing a double buffer vacuum system according to the present invention.

Referring now to the several drawings, and especially to FIG. 1, there is illustrated a general construction of a preferred embodiment of the double buffer vacuum system 10 for minimizing the vacuum leakage according to the present invention. The double buffer vacuum system 10 embodying the present invention includes a rough vacuum outer chamber 2 for reducing the pressure difference between the inside and outside of the high vacuum inner chamber 4 and high vacuum components connected thereto, which is maintained in the predetermined pressure between the atmospheric pressure and the inner pressure of the high vacuum inner chamber 4 by a second rough vacuum pump 76, as will be described herein. The rough vacuum outer chamber 2 consists of first and second rough vacuum chambers 6 and 8 defined, respectively, by upper and lower portions 11 and 12 which are generally manufactured by either welding the wall members to the welded frame, or welding the wall members with each other at their periphery. The upper portion 11 of the rough vacuum outer chamber 2 has a hinged outer door 32 mounted hermetically on one side wall thereof, and encloses the high vacuum inner chamber 4 for producing the high, or ultrahigh vacuum zone.

The high vacuum inner chamber 4 includes a hinged inner door 14, as well known in the prior art, mounted hermetically to one side wall thereof opposite to the side wall of the rough vacuum inner chamber 2 to which the hinged outer door 32 is disposed. Projecting upwardly from a valve 16 mounted on a sleeve-like flange 22 adjacent to the center of the top wall of the high vacuum inner chamber 4, and joined hermetically with the top wall of the first rough vacuum chamber 6 is a vent line 34. The vacuum communication between the high vacuum chamber 4 and the first rough vacuum chamber 6 is controlled by a first exhaust valve 18 which is mounted on a sleeve-shaped flange 20 upwardly projecting from one side portion of the top wall of the high vacuum inner chamber 4.

Figure 2:
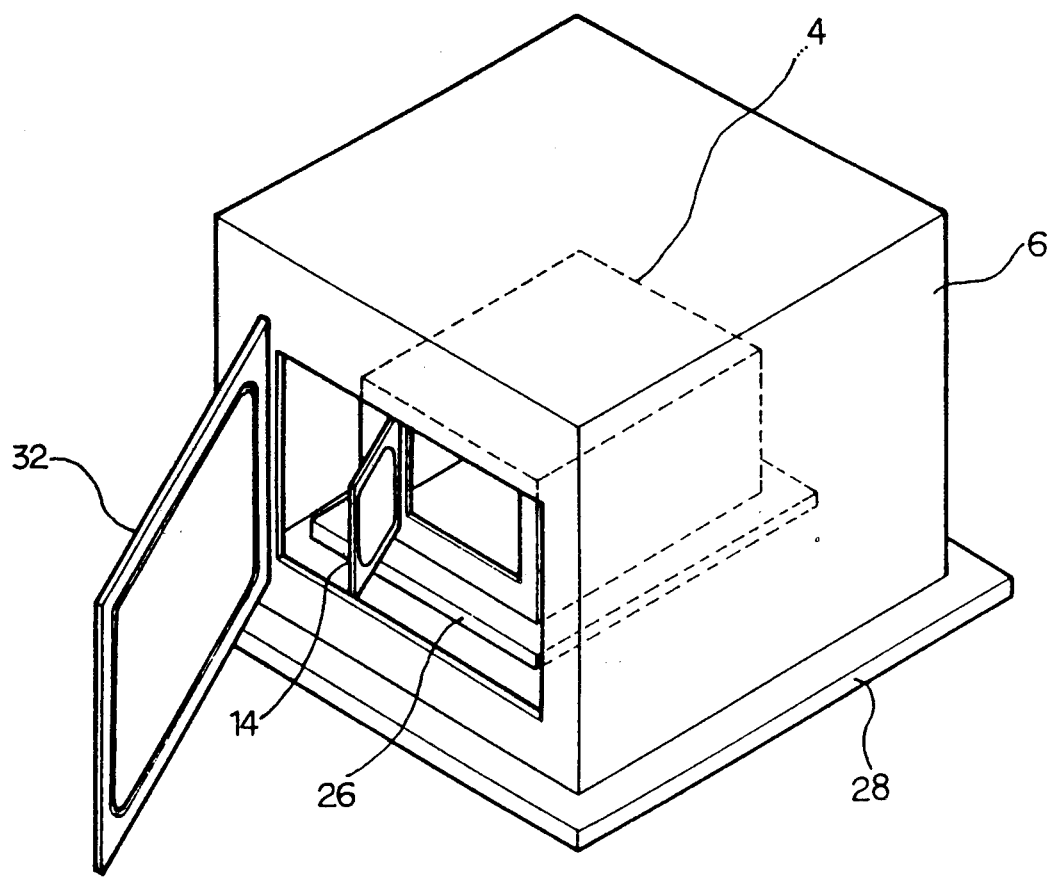
FIG. 2 is a schematic, perspective view showing a upper portion of a rough vacuum outer chamber, and a high vacuum inner chamber of the double buffer vacuum system according to the present invention.

The high vacuum inner chamber 4 further includes a base flange 26 projecting laterally and outwardly from a lower end portion of side wall surface thereof (see FIG. 2). The base flange 26 is bolted with a base plate 24 (not shown in FIG. 2) by means of making use of a O-ring. The base plate 24 is composed of a center section 36 defining the bottom wall of the high vacuum inner chamber 4, and a edge section 38 defining the bottom wall of the first rough vacuum chamber 6. Both the center section 36 and the edge section 38 also define the top wall of the second rough vacuum chamber 8. The edge section 38 is bolted hermetically at edges of the top end and bottom end surfaces thereof with, respectively, base flanges 28 and 30 of the upper and lower portions 11 and 12. The base flanges 28 and 30 project laterally and outwardly from the bottom end of the upper portion 11 and the top end of the lower portion 12, respectively. A second exhaust valve 40 is mounted on a given position of the edge section 38 of the base plate 24 to control the vacuum communication between the first and second rough vacuum chamber 6 and 8.

The high vacuum inner chamber 4 also includes a cooling and heating coil 42 for selectively cooling, or heating some components mounted on the high vacuum inner chamber 4, which is disposed hermetically in the vincity of the center of the center section 36 of the base plate 24, and a first vacuum gauge 46 mounted hermetically on a sleeve-like flange 48 which is projected downwardly from the base plate 24 at the edge of the center section 36 thereof, as well known in the prior art. A liquid feeding pipe 50 of the cooling and heating coil 42 is connected to the supply source (not shown) through sealing means 52 of the bottom wall of the second rough vacuum chamber 8, whereas a gauge cable 54 of the first vacuum gauge 46 is connected to the control unit (not shown), as well known in the prior art, through sealing means 55 of the bottom wall of the second rough vacuum chamber 8. It should be noted that the control unit is connected with the valves 16, 18, 40, 59, 64, 66 and 80, and pumps 62, 70, and 76, as well as the vacuum gauges 46 and 82 to control the double buffer vacuum system. The high vacuum inner chamber 4 at the top of high vacuum pumping port 57 of the base plate 24 is connected in vacuum communication with one end of T-shaped adapter tube 56. A sleeve-like side flange 58 of the T-shaped adapter tube 56 is connected to the first rough vacuum line 60 through the first valve 59, as known in the prior art. The first rough vacuum line 60 is penetrated through the sealing means 61 on the bottom wall of the second rough vacuum chamber 8, and connected to a first rough vacuum pump 62. The other end of T-shaped adapter tube 56, as known in the prior art, is connected in vacuum communication with the first rough vacuum pump 62 via the gate valve 66, the high vacuum pump 70 and the second valve 64. The high vacuum pump 70 which is roughly illustrated in FIG. 1 is composed of one of high vacuum pumps consisting of the oil diffusion pump, the cryogenic pump, and the turbomolecular pump, and penetrated hermetically through the bottom wall of the second rough vacuum chamber 8 between the gate valve 66 and the second valve 64. The gate valve 66 is controlled by the solenoid valve 68 which controls the supply of the compressed airs from the compressed air line 72 to the aircylinder 69. The compressed air line 72 is connected to the compressed air source (not shown) through the sealing means 74 on the bottom wall of the second rough vacuum chamber 8.

The double buffer vacuum system according to the present invention further includes a second rough vacuum pump 76 for producing the rough vacuum, preferably about $10^{-3}$ mbar or more in the rough vacuum outer chamber 6 and 8, which is connected to the bottom wall of the second rough vacuum chamber 8 via the second rough vacuum line 78 having a third valve 80. When the rough vacuum outer chamber 2 reached the predetermined pressure, the second rough vacuum pump 76 can be stopped by the control unit (not shown) which is controlled by a second vacuum gauge 82, if desired. The second vacuum gauge 82 is disposed hermetically in the predetermined position of the bottom wall of the second rough vacuum chamber 8.

As mentioned above, the lower portion 12 of the rough vacuum outer chamber 2 which is bolted at the base flange 30 thereof with the edge of the bottom end surface of the base plate 24 envelops hermetically all of high vacuum components such as the cooling and heating coil 42, the first vacuum gauge 46, the T-shaped adapter tube 56, and the high vacuum pump 70.

Accordingly, the leakage cause portions defined by the high vacuum sealed portions are not exposed to the atmosphere, but maintained within the predetermined pressure between the atmospheric pressure and the inside pressure of the high vacuum inner chamber 4. Assuming that the vacuum of the rough vacuum outer chamber 2 and the high vacuum inner chamber 4 is, respectively, about $10^{-3}$ mbar, and about $10^{-7}$ mbar, the pressure difference between the high vacuum inner chamber 4 and the rough vacuum outer chamber 2 is $10^{-3}$ minus $10^{-7}$ mbar. This is negligible pressure difference. Therefore, the high vacuum inner chamber 4 of the present invention can obtains the leakfree-condition.

In view of these facts, the high vacuum inner chamber 4 will be able to be selectively fabricated by some other methods in addition to the welding method.

Figure 3:
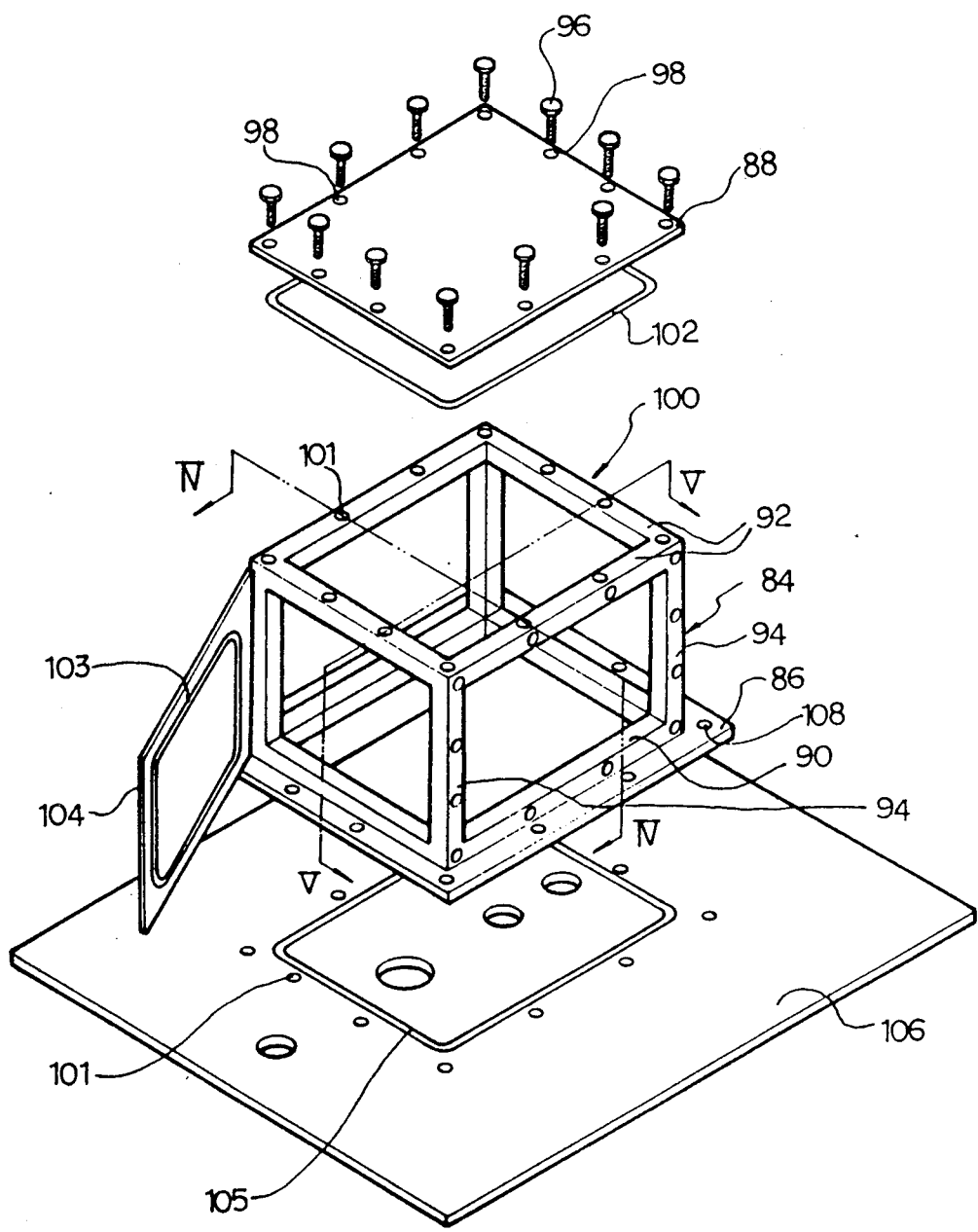
FIG. 3 is a fragmentary, exploded view showing an alternative construction of the high vacuum inner chamber according to the present invention.
Figure 4:
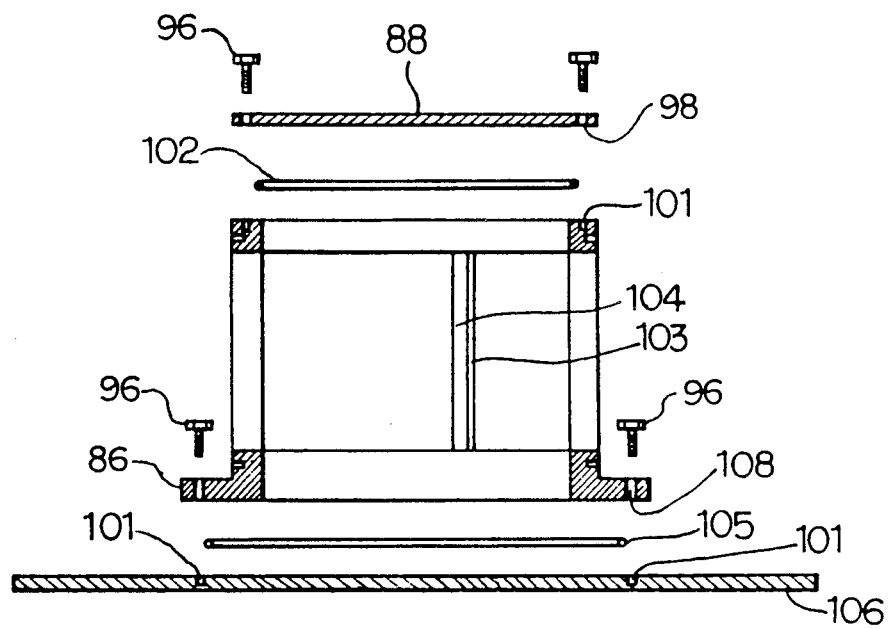
FIG. 4 is a cross-sectional view of the high vacuum inner chamber according to the present invention, as seen along arrows IV—IV of FIG. 3.
Figure 5:
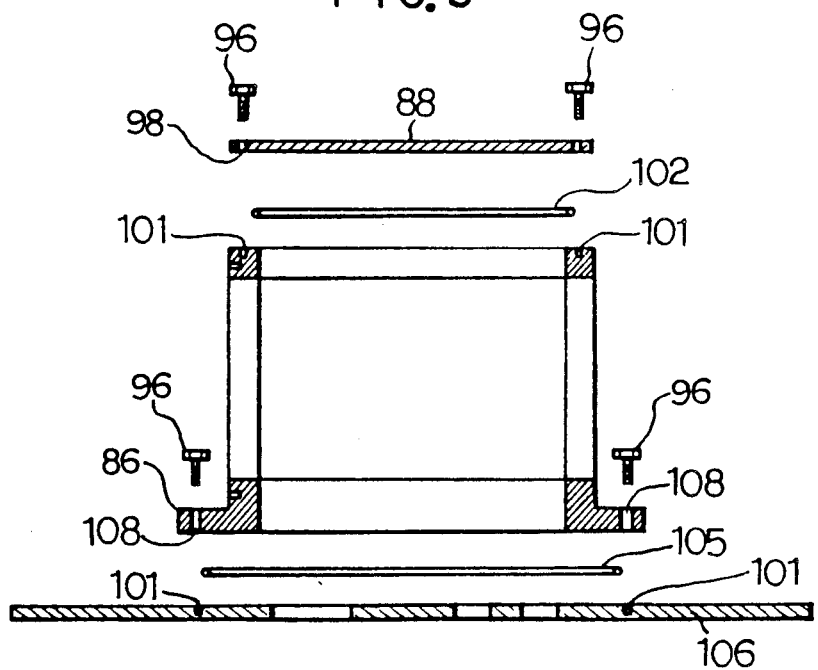
FIG. 5 is a cross-sectional view of the high vacuum inner chamber according to the present invention, as seen along arrows V—V of FIG. 3.

Referring now to FIG. 3, 4 and 5, there are illustrated an alternative embodiment 100 of the high vacuum inner chamber according to the present invention, which is produced by the method of bolting wall members, such as the wall plates with respect to a welded frame 84. The welded frame 84 is composed of a pulrality of bar members which is end-to-end welded. Projected outwardly and laterally from the lower end portion of the side surface of the respective lower transverse bar member 90 is the base flange 86.

A top wall plate 88 is bolted to the top end surface of the upper transverse bar member 92 of the welded frame 84. Each of the bolts 96 threads through respective spaced hole 98 which is formed in the edge of the wall plate 88, and lodges in respective corresponding hole 101 of the upper transverse bar member 92. To prevent the vacuum leakage, O-ring 102 is disposed in place between the top wall plate 88 and the top end surface of the upper transverse bar member 92.

Likewise, three side wall plates (not shown in FIG. 3) are bolted, respectively, to corresponding outer side surface of the vertical bar members 94 of the welded frame 84, and each of the O-rings (not shown) is disposed between the respective outer side surface of the vertical bar member 94 and respective side wall plate. The inner door 104 is hinged on one of the vertical bar member 94 (see FIG. 3), and can be locked by suitable means (not shown) such as a latch. The O-ring 103 is fixed to the inner surface of the hinged inner door 104.

As shown in FIG. 3, 4 and 5, the base plate 106 joins with the bottom end surface of the base flange 86 and the lower transverse bar member 90, and defines the bottom wall of the high vacuum inner chamber 100. The O-ring 105 is disposed between the base plate 106 and the bottom end surface of the lower transverse bar member 90. Each of the bolts 96 threads through respective spaced hole 108 which is formed in the base flange 86, and lodges in respective corresponding hole 101 of the base plate 106.

Thus manufactured, the high vacuum inner chamber 100 has the conductance of leak C greater than that of the high vacuum inner chamber of prior art manufactured by the welding method, but that is little worth consideration because the high vacuum inner chamber is enclosed by the rough vacuum outer chamber, i.e., the pressure difference between the outside and inside of the high vacuum inner chamber is insignificant. Therefore, the wall plate of this high vacuum inner chamber can be designed in greatly smaller thickness and strength than that of the conventional high vacuum chamber, and accordingly, made from thin plate, or foil of stainless steel 304, or aluminium alloy, for example. The high vacuum inner chamber 100 also premits the surface treatment process, cleaning, maintenance and repairs to be easily performed, because it is fabricated by bolt-assembling method.

Alternatively, the frame of the high vacuum inner chamber 100 can be made by the method of assembling a plurality of bar members by means of making use of the bolts, and vacuum leak sealant, or O-rings. Also, the metal gaskets can be used instead of the O-rings.

The operation of the double buffer vacuum system according to the present invention will now be described. Let it be assumed that the rough vacuum outer chamber 2 and the high vacuum inner chamber 4 are maintained in the atmospheric pressure before operating the double buffer vacuum system.

At first, the first valve 59, the second valve 64, and the gate valve 66 are closed, and the first and second exhaust valve 18 and 40, and the third valve 80 are then opened, by means of making use of the control unit. When the second rough vacuum pump 76 is operated to produce the rough vacuum, preferably about $10^{-3}$ mbar or more, the rough vacuum produced by the second rough vacuum pump 76 is applied to the high vacuum inner chamber 4 via the second rough vacuum chamber 8, the second exhaust valve 40, the first rough vacuum chamber 6, and the first exhaust valve 18, so that the pressure of the rough vacuum outer chamber 2 and the high vacuum inner chamber 4 is changed from the atmospheric pressure to the rough vacuum. As the rough vacuum outer chamber 2 reached the predetermined vacuum, preferably about $10^{-3}$ mbar or more, the second rough vacuum pump 76 can be stopped by the control unit which is connected to the second vacuum gauge 82, so as to reduce the waste of the electric power, if desired.

After the first exhaust valve 18 is closed and the second valve 64 is opened, the first rough vacuum pump 62 is operated to produce the rough vacuum in the inner space of the high vacuum pump 70. Then, the second valve 64 is closed and the first valve 59 is opened. The first rough vacuum pump 62 again pumps the high vacuum chamber 4 to assure the rough vacuum. When the first valve 59 is closed and the gate valve 66 is opened, the high vacuum pump 70 is operated to produce the high vacuum, preferably about $10^{-7}$ mbar or more in the high vacuum inner chamber 4. Thus, the double buffer vacuum system 10 can produces the high vacuum without particular vacuum leakage.

In venting process, the double buffer vacuum system 10 always permits the high vacuum inner chamber 4 to be vented in the direction of the rough vacuum outer chamber 2 from the vent line 34 through the high vacuum inner chamber 4, the first exhaust valve 18 and the second exhaust valve 40. Accordingly, the high vacuum inner chamber 4 will always be maintained cleanly by preventing the backstream of the second rough vacuum pump oil vapors from the rough vacuum outer chamber 2 to the high vacuum inner chamber 4, which are generated from the second rough vacuum pump 76 during operation thereof.

From the foregoing, it can be seen that there has been provided an improved vacuum system which is able to minimize the vacuum leakage, to facilitate cleaning, maintenance, repairs and manufacturing, and to cut down expenses for high vacuum materials for chamber body. Particularly, the present invention provides an improved double buffer vacuum system for minimizing the vacuum leakage that the thermal conductivity is minimum, even though it will be utilized in either the equipments demanding the high temperature such as the vacuum melting and casting equipment, or the vacuum cryogenic equipments demanding the low temperature, because the pressure of the rough vacuum outer chamber will be maintained in the vacuum of about $10^{-3}$ mbar or more which is the lowest thermal conductivity condition.

It will be understood that the above description of the present invention is susceptible to various modifications, changes and adaptations, and the same are intended to be comprehended within the meaning and range of equivalents of the appended claims.

What is claimed is:

1. A double buffer vacuum system which comprises:
   a rough vacuum outer chamber capable of being hermetically sealed and being divided into an upper and lower portion by a plate, the upper portion of the outer chamber having a hermetically sealable door;
   a high vacuum inner chamber capable of being hermetically sealed and being positioned within the upper portion of the outer chamber and hermetically attached to the plate which divides the upper and lower portions of the outer chamber, the inner chamber having a hermetically sealable door;
   a high vacuum pump located within the lower outer chamber and hermetically connected to the inner chamber;
   a first exhaust valve hermetically connected to the inner chamber and capable of controlling the vacuum communication between the inner chamber and the upper outer chamber;
   a second exhaust valve located in and transversing the plate and capable of controlling the vacuum communication between the upper and lower outer chambers; and
   a rough vacuum pump connected in vacuum communication with the lower outer chamber.

2. A double buffer vacuum system of claim 1, wherein the high vacuum inner chamber is formed by hermetically bolting walls onto a frame composed of a plurality of bars which are end-to-end welded.

3. A double buffer vacuum system of claim 1, wherein the high vacuum inner chamber maintains a vacuum of greater than about $10^{-7}$ mbar and the outer chamber maintains a vacuum of greater than about $10^{-3}$ mbar.

4. A double buffer vacuum system of claim 2, wherein the walls are made from stainless steel 304, or aluminum alloy.

5. A double buffer vacuum system of claim 1, wherein the high vacuum inner chamber is formed by hermetically bolting walls onto a frame composed of a plurality of bars which are bolted to each other in the presence of a vacuum leak sealant.

6. A double buffer vacuum system of claim 1, wherein the hermetically sealable doors are hinged.

7. A double buffer system of claim 1 which further comprises an additional rough vacuum pump connected in vacuum communication to the high vacuum pump.

8. A double buffer system of claim 1 which further comprises a heating and cooling coil present within the inner chamber.

9. A double buffer system of claim 1 which further comprises a heating and cooling coil present within the outer chamber.

* * * * *